United States Patent
Jin et al.

(10) Patent No.: US 7,078,306 B1
(45) Date of Patent: Jul. 18, 2006

(54) METHOD FOR FORMING A THIN FILM RESISTOR STRUCTURE

(75) Inventors: Gaolong Jin, Hillsboro, OR (US); Wanqing Cao, Portland, OR (US); Guo-Qiang Lo, Portland, OR (US); Shih-Ked Lee, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 53 days.

(21) Appl. No.: 10/805,718

(22) Filed: Mar. 22, 2004

Related U.S. Application Data

(60) Provisional application No. 60/457,071, filed on Mar. 24, 2003.

(51) Int. Cl.
*H01L 21/20* (2006.01)

(52) U.S. Cl. .................. 438/384; 438/382; 438/385

(58) Field of Classification Search ............ 438/382, 438/384, 385
See application file for complete search history.

(56) References Cited

U.S. PATENT DOCUMENTS

| | | | |
|---|---|---|---|
| 5,585,301 A * | 12/1996 | Lee et al. ................ | 438/20 |
| 5,710,070 A | 1/1998 | Chan | |
| 6,127,217 A * | 10/2000 | Madurawe et al. ........ | 438/238 |
| 6,461,929 B1 * | 10/2002 | Lobl et al. ............... | 438/381 |
| 6,466,124 B1 * | 10/2002 | Shibuya et al. ........... | 338/308 |

* cited by examiner

*Primary Examiner*—Trung Dang
(74) *Attorney, Agent, or Firm*—Kenneth Glass; Glass & Associates

(57) ABSTRACT

The present invention relates to a method for forming a thin film resistor and a thin film resistor formed over a semiconductor substrate. A gate structure is formed and a dielectric layer is formed over the gate structure. A via is then etched that extends through the dielectric layer so as to expose a portion of the gate structure. A layer of titanium nitride is deposited using a chemical vapor deposition process. A rapid thermal anneal is performed in an oxygen ambient. The rapid thermal anneal incorporates oxygen into the titanium nitride, forming titanium oxynitride film. A layer of dielectric material is then deposited and etched-back to form a dielectric plug that fills the remaining portion of the via. The titanium oxynitride film is patterned to form a titanium oxynitride structure that is electrically coupled to the gate structure. A metal layer is deposited and patterned to form an interconnect structure that electrically couples the titanium oxynitride structure to other circuitry.

10 Claims, 8 Drawing Sheets

METHOD FOR FORMING A THIN FILM RESISTOR STRUCTURE

CROSS REFERENCE TO RELATED APPLICATION

This application claims priority to U.S. Provisional Application Ser. No. 60/457,071, entitled "THIN FILM RESISTOR STRUCTURE AND METHOD FOR FORMING THIN FILM RESISTOR STRUCTURE" and filed on Mar. 24, 2003, which is incorporated herein by reference.

This application claims the benefit of Provisional application No. 60/457,071, filed Mar. 24, 2003.

FIELD OF THE INVENTION

The present invention relates to the field of semiconductor devices. More specifically, the present invention relates to thin film resistors and methods for forming thin film resistors.

BACKGROUND ART

Thin film resistors are commonly used as passive devices in mixed-mode integrated circuit devices. Traditionally, thin film resistors are fabricated using polysilicon. The resistivity of the polysilicon is manipulated by choosing appropriate polysilicon deposition temperature, pressure and doping concentration. Changing the doping concentration of the polysilicon layer allows the fabrication of resistors with desired resistance. However, it is difficult to maintain the stability of a polysilicon resistor because it is subject to grain structure evolution (from the different thermal cycles of the fabrication process) and hydrogen-concentrations emitted from surrounding dielectric materials (e.g., Plasma-Enhanced CVD Silicon-Nitride). Although polysilicon is routinely used in manufacturing, the controllable resistivity range is typically $\sim 10^{-3}$–$10^{-2}$ $\Omega \cdot cm$ (or Sheet-Resistance of approximately 100–1000 $\Omega$/square for 1000 Angstroms film). The sheet resistance can be changed by increasing or decreasing the film thickness. However, the uniformity of polysilicon thin film degrades as film thickness decreases. Also, grain structure dependence on thickness and limitations of printing and patterning capability limit the increased resistance that can be obtained by varying thickness. Also, it is difficult to control the quality of the product due to the diffusion of doped materials during subsequent processing steps when a wider range of resistances are needed.

Typical metal-based thin film resistors have low resistivity (in the range of $10^{-5}$ to $10^{-3}$ $\Omega \cdot cm$). For high resistance applications, Chromium (Cr) based thin films have been developed. Chromium films have a relatively high resistance 0.1–1 $\Omega \cdot cm$. Though Chromium films provide a relatively high resistivity, there is a need for thin-film resistors having even higher resistivity (higher than $\sim 1$ $\Omega \cdot cm$). Also, chromium is not commonly used in standard VLSI processing techniques. Thus, methods that use Chromium-based thin films will be difficult and costly to implement into conventional manufacturing processes.

Titanium nitride that is deposited using chemical vapor deposition (CVD TiN) is commonly used as a barrier material in semiconductor fabrication processes. However, CVD TiN film is not commonly used in thin film resistor applications as it has poor resistance stability. Also, the resistivity of a conventional CVD TiN film (typically $10^{-2}$ to $5 \times 10^{-2}$ $\Omega \cdot cm$) is not high enough for most applications. Moreover, the CVD TiN films' resistance drifts with time when the film is exposed to ambient. This instability imposes a serious limitation to the film's usage as a resistor. As the footprint of advanced IC devices has decreased, there is no longer sufficient "real estate" for the layout of long wired resistors. Accordingly, there is a need for a resistor that takes up less "real estate" on the semiconductor device.

Accordingly, what is needed is a thin film resistor and a method for forming a thin film resistor having good resistance stability with different process flows (i.e., thermal cycles, ambient, etc.) and having a wide range of resistivity. Also, a thin film resistor and a method for forming a thin film resistor is needed that meets the above needs, that uses less semiconductor "real estate" and that can be easily implemented into conventional manufacturing processes. The method and apparatus of the present invention meets the above needs.

DISCLOSURE OF THE INVENTION

The present invention provides a method for forming a thin film resistor and a thin film resistor having good resistance stability and having a wide range of resistivity. The thin film resistor of the present invention uses less horizontal space than prior art thin film resistors. Also, the method for forming a thin film resistor of the present invention can be easily incorporated into current semiconductor fabrication processes.

A method for forming a thin film resistor is disclosed in which titanium oxynitride is used as a thin film resistor. In one embodiment a gate structure is formed over a semiconductor substrate. A protective layer of silicon nitride is then deposited. A dielectric layer is formed that overlies the silicon nitride layer. A via is formed that extends through the dielectric layer and through the silicon nitride layer so as to expose a portion of the gate structure.

A layer of titanium nitride is deposited using a chemical vapor deposition process. The layer of titanium nitride overlies the exposed portion of the gate structure and extends vertically along the sidewalls of the opening in the dielectric layer so as to partially fill the opening. A portion of the titanium nitride layer also extends over the top surface of the dielectric layer.

A rapid thermal anneal is performed in an oxygen ambient. The rapid thermal anneal densifies the film and incorporates oxygen into the titanium nitride, forming a titanium oxynitride film. The anneal process significantly increases the resistivity of the titanium nitride layer. By adjusting the conditions of the rapid thermal anneal process the resistivity of the resulting titanium oxynitride film can be varied from a resistivity of from approximately $-5 \times 10^{-4}$ $\Omega \cdot cm$ to a resistivity of 1 $\Omega \cdot cm$.

A layer of dielectric material is then deposited and etched to form a dielectric plug that completely fills the remainder of the via. Mask and etch steps are performed to pattern the titanium oxynitride film forming a titanium oxynitride structure that is electrically coupled to the gate structure.

In one embodiment an interconnect structure is formed by depositing a layer of metal over the titanium oxynitride film prior to masking and etching to pattern the titanium oxynitride film. In this embodiment the mask and etch steps simultaneously form the titanium oxynitride structure and the overlying interconnect structure. In another embodiment the interconnect structure is formed in a separate patterning step that is performed after the formation of the titanium oxynitride structure.

The thin film resistor of the present invention has high resistance stability and has a wide range of resistivity with excellent stability. Also, the thin film resistor of the present invention is suitable for high resistivity applications. Moreover, because titanium nitride is commonly used in standard VLSI semiconductor fabrication processes, the method and apparatus of the present invention is easily incorporated into a semiconductor fabrication process.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
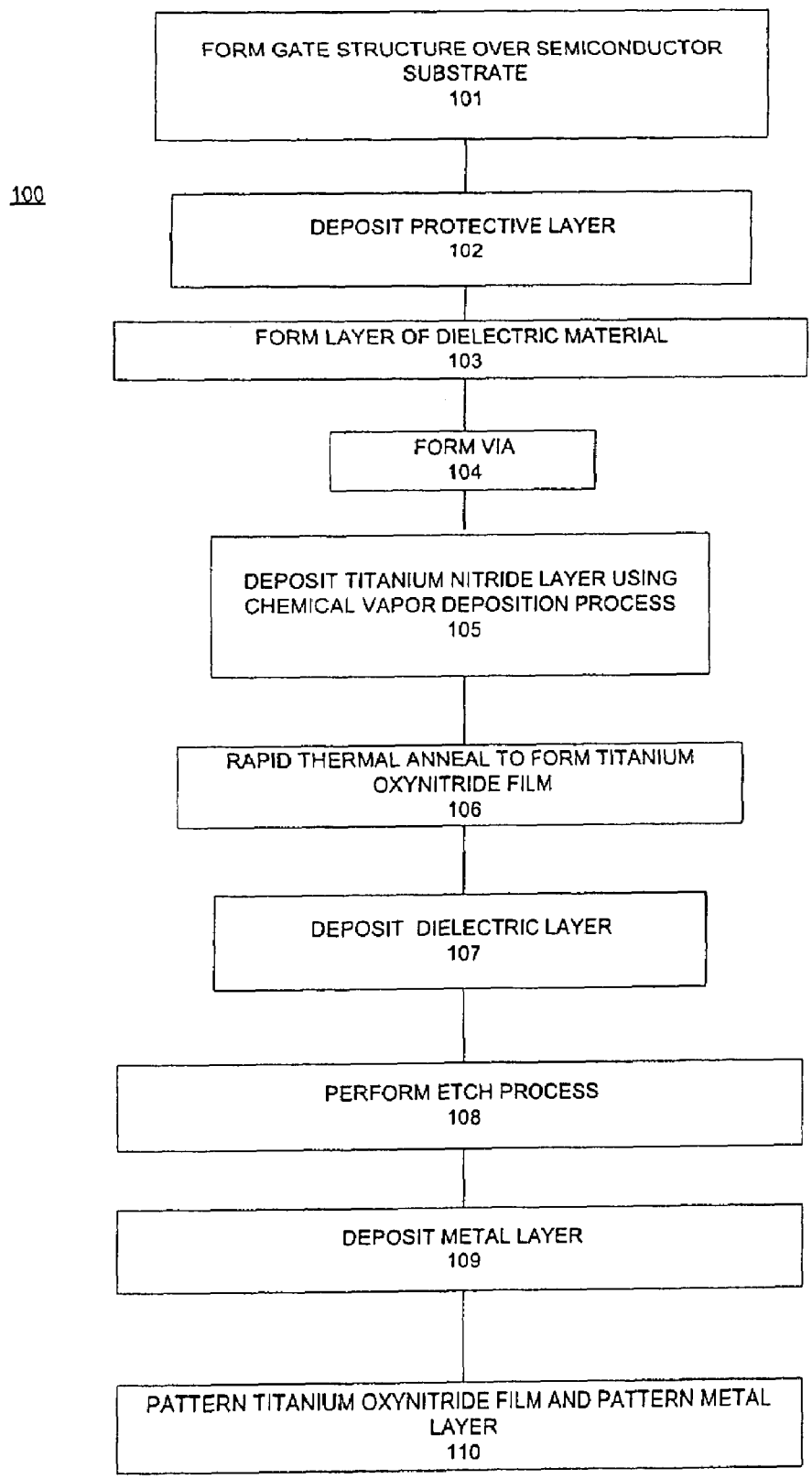
FIG. 1 is a flow chart that illustrates a method for forming a thin film resistor on a semiconductor substrate in accordance with one embodiment of the present invention.

FIG. 1 illustrates a method 100 for forming a thin film resistor on a semiconductor substrate. As shown by step 101 a gate structure is formed over a semiconductor substrate. In the embodiment shown in FIG. 2, the gate structure 10 includes gate oxide layer 4, polysilicon layer 5, and conductive layer 6. Gate structure 10 also includes silicon oxynitride layer 7 and silicon nitride layer 8 which overlie conductive layer 6. Gate structure 10 also includes spacers 9 disposed on the sides of gate structure 10.

Figure 2:
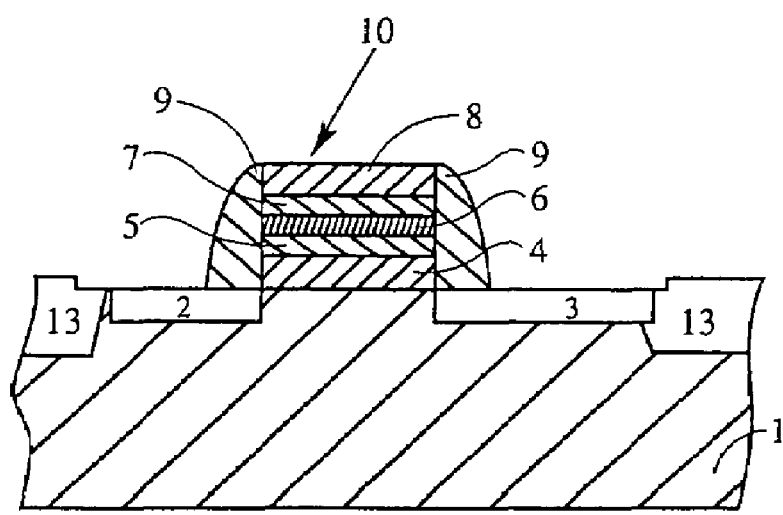
FIG. 2 is a side cross-sectional view of a portion of a semiconductor substrate over which source, drain and gate structures have been formed in accordance with one embodiment of the present invention.

FIG. 2 shows an embodiment in which a gate structure 10 is formed over a semiconductor substrate 1 that includes dielectric-filled trenches 13 that isolate portions of semiconductor substrate 1. A portion of gate structure 10 extends between source 2 and drain 3.

In the present embodiment, conductive layer 6 is tungsten silicide. However, it is appreciated that other conductive materials could also be used. Also, though the gate structure of the present invention is shown to include layers 4–8 it is appreciated that gate structure 10 could include more or fewer layers. For example, a gate structure could be formed that does not include protective layers 7–8. Alternatively, a gate structure could be used that includes additional protective layers. In addition, spacers 9 could include more layers (e.g., an underlying oxide layer).

Figure 3:
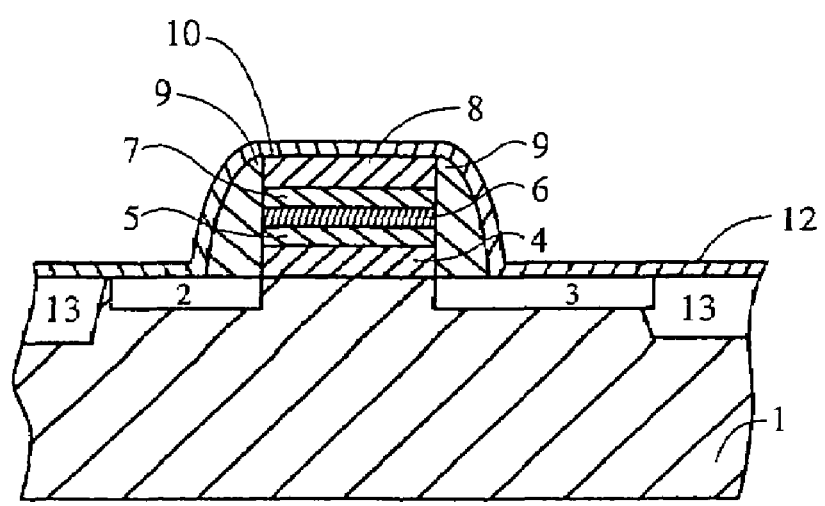
FIG. 3 is a side cross-sectional view of the structure of FIG. 2 after a protective layer has been deposited thereover in accordance with one embodiment of the present invention.

As shown by step 102, a protective layer is deposited. This protective layer protects the underlying structures during subsequent process steps. FIG. 3 shows an embodiment in which protective layer 12 is formed over substrate 1.

Protective layer 12 overlies gate structure 10 and overlies the top surface of semiconductor substrate 1. In one embodiment, protective layer 12 is a layer of silicon nitride ($Si_3N_4$). Alternatively, protective layer 12 is silicon oxynitride ($Si_xN_yO_z$).

Though method 100 includes the deposition of a protective layer in step 102 it is appreciated that the present invention could be practiced without the use of a protective layer 12. Also, the protective layer deposited in step 102 could include the deposition of multiple protective layers.

A layer of dielectric material is formed as shown by step 103 of FIG. 1. In the present embodiment the dielectric layer includes both tetraethylorthosilane (TEOS) and borophosphosilicate glass (BPSG). However, it is appreciated that other dielectric materials could also be used.

Figure 4:
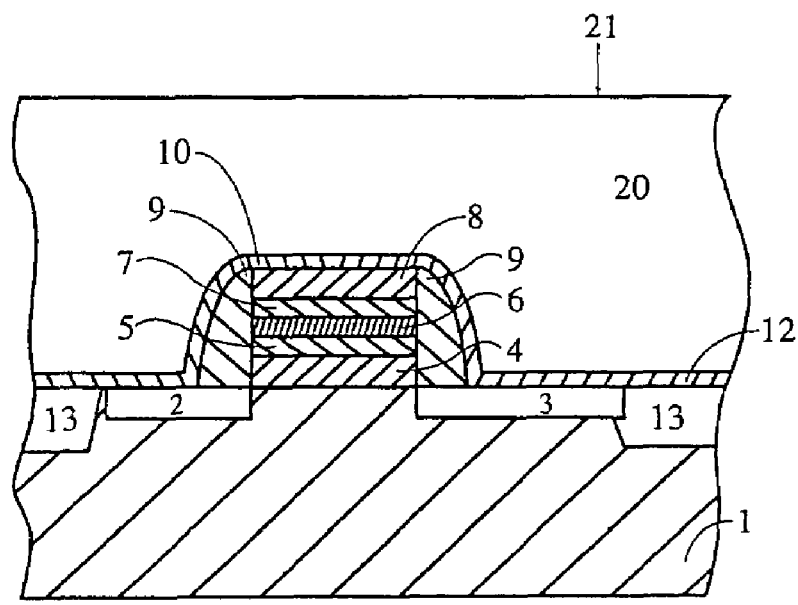
FIG. 4 is a side cross-sectional view of the structure of FIG. 3 after a layer of borophosphosilicate glass (BPSG) has been deposited and planarized using a chemical mechanical polishing process, and after a layer of tetraethylorthosilane (TEOS) has been deposited so as to form a layer of dielectric material having a planar top surface in accordance with one embodiment of the present invention.

In the embodiment illustrated in FIG. 4, a dielectric layer 20 is shown that is formed using both BPSG and TEOS. In this embodiment a layer of BPSG is deposited such that the BPSG layer directly overlies protective layer 12. The layer of BPSG is then planarized using a chemical mechanical polishing process to give a layer of BPSG having a thickness of approximately 6 kA (thousand Angstroms) from the substrate surface. A layer of TEOS is then deposited over the planarized BPSG layer, forming a dielectric layer 20 that has a planar top surface 21. In one embodiment, the layer of TEOS has a thickness of approximately 1 kA, giving a dielectric layer 20 that is approximately 7 kA thick.

Figure 5:
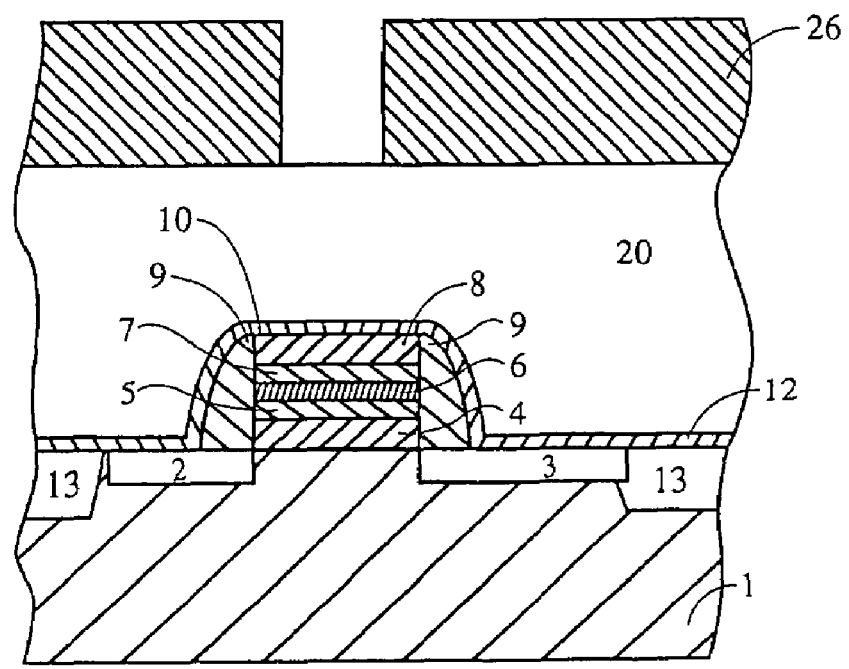
FIG. 5 is a side cross-sectional view of the structure of FIG. 4 after a photoresist masking structure has been formed thereover in accordance with one embodiment of the present invention.
Figure 6:
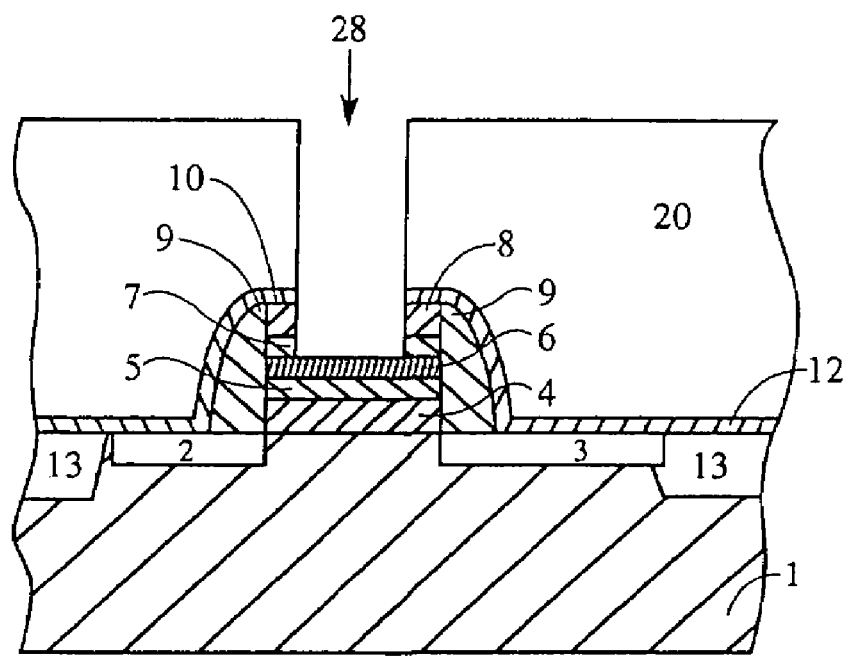
FIG. 6 is a side cross-sectional view of the structure of FIG. 5 after an etch step has been performed so as to etch an opening that extends through the dielectric layer and through the layer of silicon nitride in accordance with one embodiment of the present invention.
Figure 7:
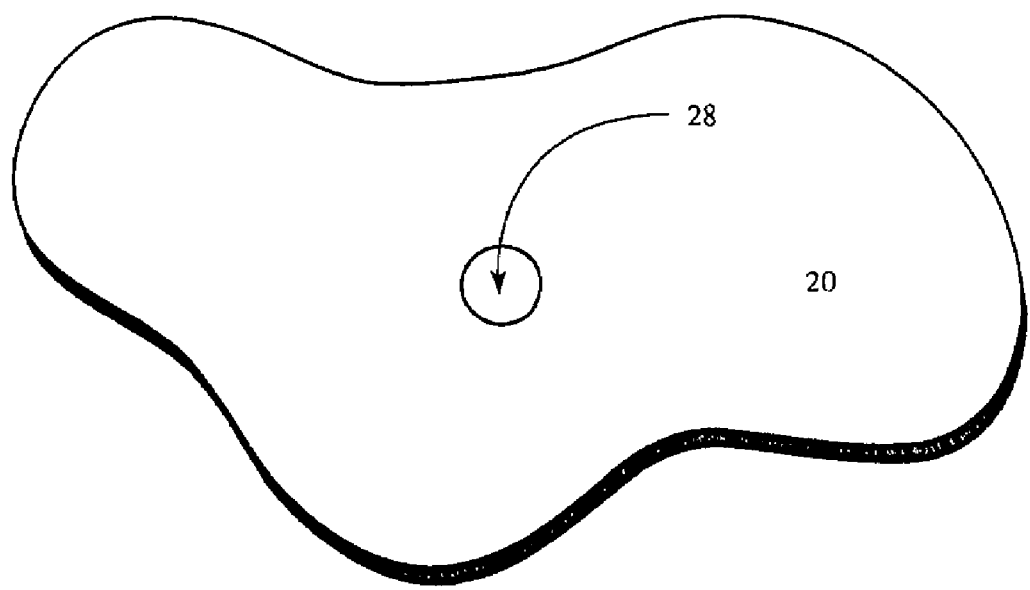
FIG. 7 is top view of the structure of FIG. 6 in accordance with one embodiment of the present invention.

A via is formed as shown by step 104 of FIG. 1. More particularly, an opening is formed that extends through the layer of dielectric material 20 and through layer of silicon nitride 12. FIGS. 5–6 illustrate an embodiment in which a via 28 is formed by depositing, exposing and developing a layer of photoresist material to form a photoresist masking structure 26. An etch step is then performed to form an opening 28 that extends through dielectric layer 20 and through protective layer 12 so as to expose a portion of gate structure 10. In the present embodiment, opening 28 also extends through layers 7–8 of gate structure 10, exposing a portion of conductive layer 6. The photoresist masking structure 26 is then removed using a conventional photoresist strip process to form the structure shown in FIGS. 6–7.

Referring now to step 105 of FIG. 1, a layer of titanium nitride (TiN) is deposited using a chemical vapor deposition process. The use of a chemical vapor deposition process gives a layer of titanium nitride having better uniformity and better conformality than can be obtained using evaporation or sputtering methods.

In one embodiment the titanium nitride is deposited in an environment that includes titanium tetrachloride gas ($TiCl_4$) ambient. In yet another embodiment a Metal Organic Chemical Vapor Deposition (MOCVD) process is used to form a titanium nitride layer. The MOCVD process can use either a tetrakis (dimethyl-amino) titanium (TDMAT) or a tetrakis (diethylamino) titanium (TDEAT) organometallic source.

Figure 8:
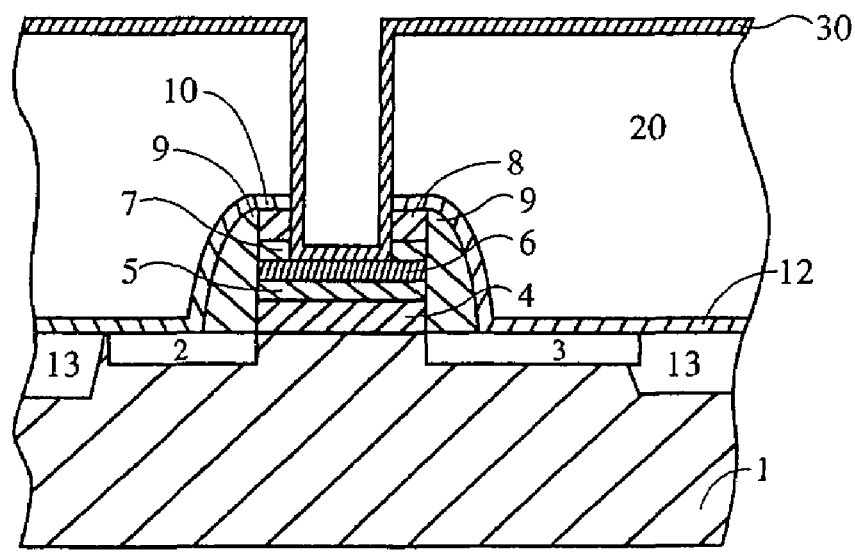
FIG. 8 is a side cross-sectional view of the structure of FIG. 6 after a layer of titanium nitride has been deposited thereover using a chemical vapor deposition process in accordance with one embodiment of the present invention.

FIG. 8 shows a titanium nitride layer 30 formed in accordance with step 105 of FIG. 1. In the present embodiment titanium nitride layer 30 has a thickness that is less than the diameter of opening 28 such that titanium nitride layer 30 only partially fills opening 28. In one embodiment opening 28 has a diameter of approximately 0.21 μm and titanium nitride layer 30 has a thickness of approximately 100–200 Angstroms such that only a portion of opening 28 is filled by titanium nitride layer 30.

Titanium nitride layer 30 extends within opening 28 such a portion of titanium nitride layer 30 directly overlies conductive layer 6. Another portion of titanium nitride layer 30 extends along the sidewalls of opening 28, conforming to the shape of opening 28. These two portions of titanium nitride layer 30 partially fill opening 28. A third portion of layer of titanium nitride layer 30 extends over top surface 21 of dielectric layer 20.

In the present embodiment, because opening 28 is round, that portion of titanium nitride layer 30 that extends along the sidewalls of opening 28 is cylindrical. As the portion of titanium nitride layer 30 that directly overlies conductive layer 6 extends horizontally, these two portions of titanium nitride layer 30 form a cylindrical shape that is closed at the bottom and open at the top.

In one embodiment the CVD titanium nitride film is treated with plasma bombardment after deposition to form a bilayer structure that includes a treated layer on top and untreated layer on the bottom. The treated layer provides high quality film with better conductivity. In another embodiment a multilayer structure of CVD titanium nitride film is used to form a multilayer structure. The multilayer structure includes an alternate untreated layer and a treated layer.

Referring now to step 106 of FIG. 1, a rapid thermal anneal is performed in an oxygen ambient. The rapid thermal anneal of step 106 incorporates oxygen into the titanium nitride, forming titanium oxynitride film 30a.

In the present embodiment the thin titanium nitride film is annealed in an oxygen environment that also includes a carrier gas such as, for example, nitrogen. In the present embodiment a temperature of from 400 to 500 degrees centigrade is used.

The anneal process significantly increases the resistivity of the titanium nitride layer. For example, a typical resistivity of the titanium nitride layer is in the range of from 100 to 500 Ohms/square for a thickness of 100A. By performing a rapid thermal anneal in an oxygen ambient this resistivity can be raised to a resistivity of from $5 \times 10^{-4}$ Ω·cm (as-deposited) to a resistivity of 1 Ω·cm (e.g., using a rapid thermal anneal of 450° C.) or higher.

In one specific embodiment, a temperature 425 degrees centigrade is used in a rapid thermal anneal process in which the wafer is heated for a time of 20 seconds. In this embodiment a flow of 0.3 standard liters per minute of oxygen gas and nitrogen gas (using a ration of 1 $O_2$/10 $N_2$) is introduced into the chamber used to perform the rapid thermal anneal process. This has been found to increase the resistivity of titanium nitride layer 30 from an initial resistivity of $6 \times 10^{-4}$ Ω·cm to a resistivity of approximately $8.65 \times 10^{-3}$ Ω·cm.

In another embodiment, a temperature 450 degrees centigrade is used in a rapid thermal anneal process in which the wafer is heated for a time of 15 seconds. In this embodiment a flow of 0.3 standard liters per minute of oxygen gas and nitrogen gas (using a ration of 1 $O_2$/10 $N_2$) is introduced into the chamber used to perform the rapid thermal anneal process. This has been found to increase the resistivity of titanium nitride layer 30 from an initial resistivity of $6 \times 10^{-4}$ Ω·cm to a resistivity of approximately $2.1 \times 10^{-2}$ Ω·cm.

In another embodiment, a temperature 450 degrees centigrade is used in a rapid thermal anneal process in which the wafer is heated for a time of 20 seconds. In this embodiment a flow of 0.3 standard liters per minute of oxygen gas and nitrogen gas (using a ration of 1 $O_2$/10 $N_2$) is introduced into the chamber used to perform the rapid thermal anneal process. This has been found to increase the resistivity of titanium nitride layer 30 from an initial resistivity of $6 \times 10^{-4}$ Ω·cm to a resistivity of approximately $4.8 \times 10^{-2}$ Ω·cm.

In another embodiment a temperature 500 degrees centigrade is used in a rapid thermal anneal process in which the wafer is heated for a time of 20 seconds. In this embodiment a flow of 0.3 standard liters per minute of oxygen gas and nitrogen gas (using a ration of 1 $O_2$/10 $N_2$) is introduced into the chamber, producing a resistivity of greater than $5\times10^{-1}$ $\Omega\cdot cm$.

The film resistivity increases monotonously with the anneal temperature and time, Therefore, a resistor can be obtained having a desirable resistivity by adjusting the anneal conditions.

The use of an anneal temperature of less than five hundred degrees is desirable in that thermal budget issues are avoided. More particularly, because the anneal temperature is so low, it does not have any significant negative thermal impact on the fabrication process.

The rapid thermal anneal of step 106 significantly improves the resistance stability of the resulting titanium oxynitride film. Titanium nitride films (deposited using a chemical vapor deposition process) that have not been annealed can have a change in resistance of as much as eighteen percent ($\delta R/R_0$) in 113 hours (where $\delta R$ is the change in resistance and where $R_0$ is the initial resistance). However, it has been found that when the rapid thermal anneal of step 106 is performed, the change in resistance is less than one percent ($\delta R/R_0$) after 113 hours. Accordingly, the present invention has better resistance stability as compared to the resistance stability of prior art titanium nitride films that have not been annealed using the rapid thermal anneal process of the present invention.

As shown by steps 107–108 of FIG. 1, the remaining portion of the via is filled with dielectric material. In the present embodiment, a layer of dielectric material is deposited as shown by step 107. In one embodiment the dielectric material is SOG (Spin on Glass) oxide that is spin-coated onto the wafer. However, it is appreciated that other dielectric materials could also be used.

Figure 9:
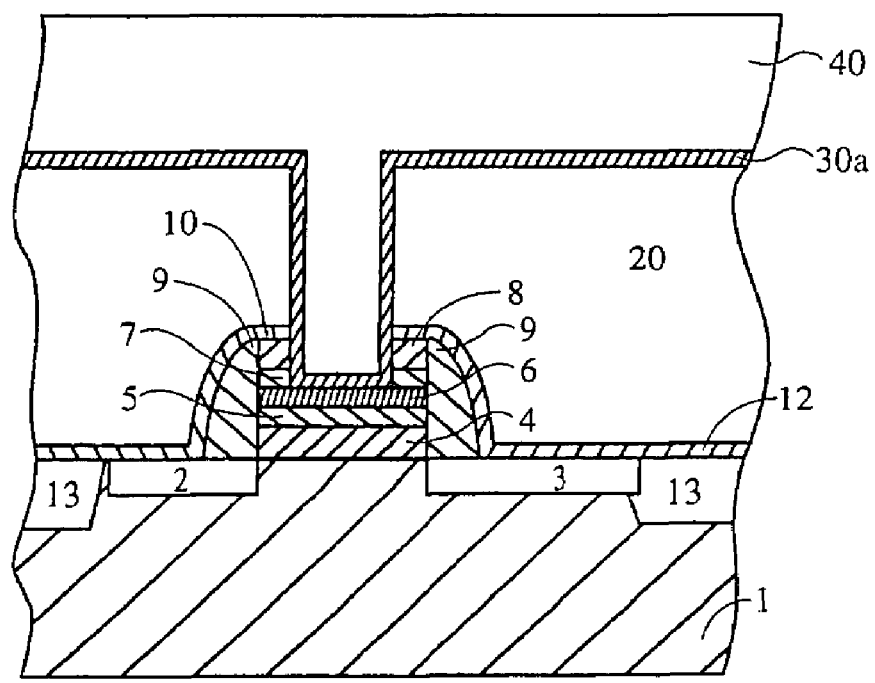
FIG. 9 is a side cross-sectional view of the structure of FIG. 8 after a rapid thermal anneal has been performed in an oxygen ambient and after a layer of dielectric has been deposited thereover in accordance with one embodiment of the present invention.

In the embodiment shown in FIG. 9 layer of dielectric material 40 is shown to be deposited such that it fills the remaining portion of opening 28. More particularly, layer of dielectric material 40 fills that portion of opening 28 that is not filled by titanium oxynitride film 30a.

Figure 10:
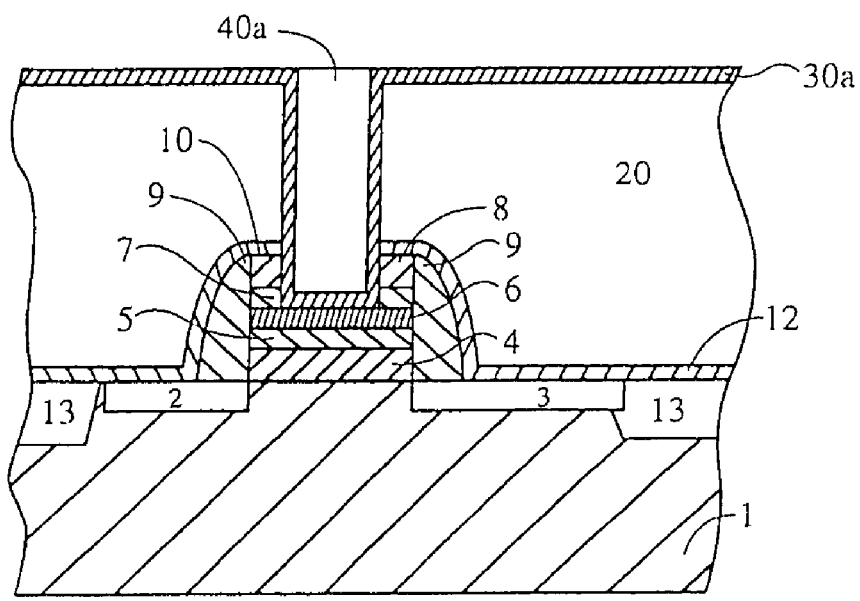
FIG. 10 is a side cross-sectional view of the structure of FIG. 9 after an etch has been performed so as to form a dielectric plug in accordance with one embodiment of the present invention.

An etch process is performed as shown by step 108 of FIG. 1 to etch-back a portion of layer of dielectric material 40. More particularly, that portion of layer of dielectric material 40 is etched that overlies the portion of titanium oxynitride film 30a that extends over the top surface 21 of dielectric layer 20. This leaves a dielectric plug 40a shown in FIG. 10 that fills the remainder of opening 28.

Figure 11:
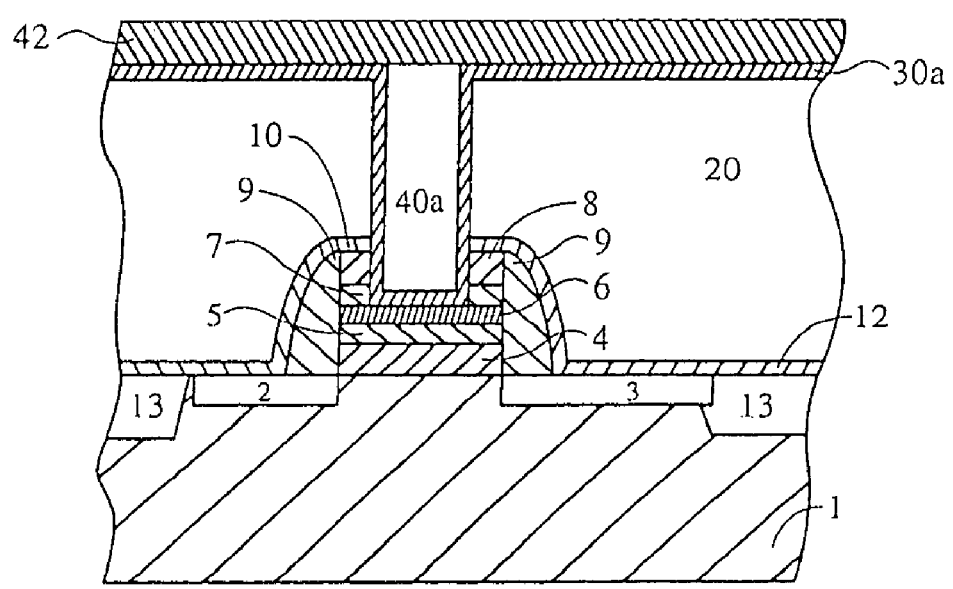
FIG. 11 is a side cross-sectional view of the structure of FIG. 10 after a layer of metal has been deposited thereover in accordance with one embodiment of the present invention.

A metal layer is then deposited as shown by step 109 of FIG. 1. In one embodiment, a Physical Vapor Deposition (PVD) process is used to deposit a layer of titanium nitride. FIG. 11 illustrates an embodiment in which metal layer 42 is deposited over semiconductor substrate 1.

As shown by step 110 the titanium oxynitride film and the metal layer are patterned. In the present embodiment the titanium oxynitride film and the metal layer are simultaneously patterned. More particularly, mask and etch steps are performed after deposition of metal layer 42 to simultaneously pattern titanium oxynitride film 30a and metal layer 42.

Figure 12:
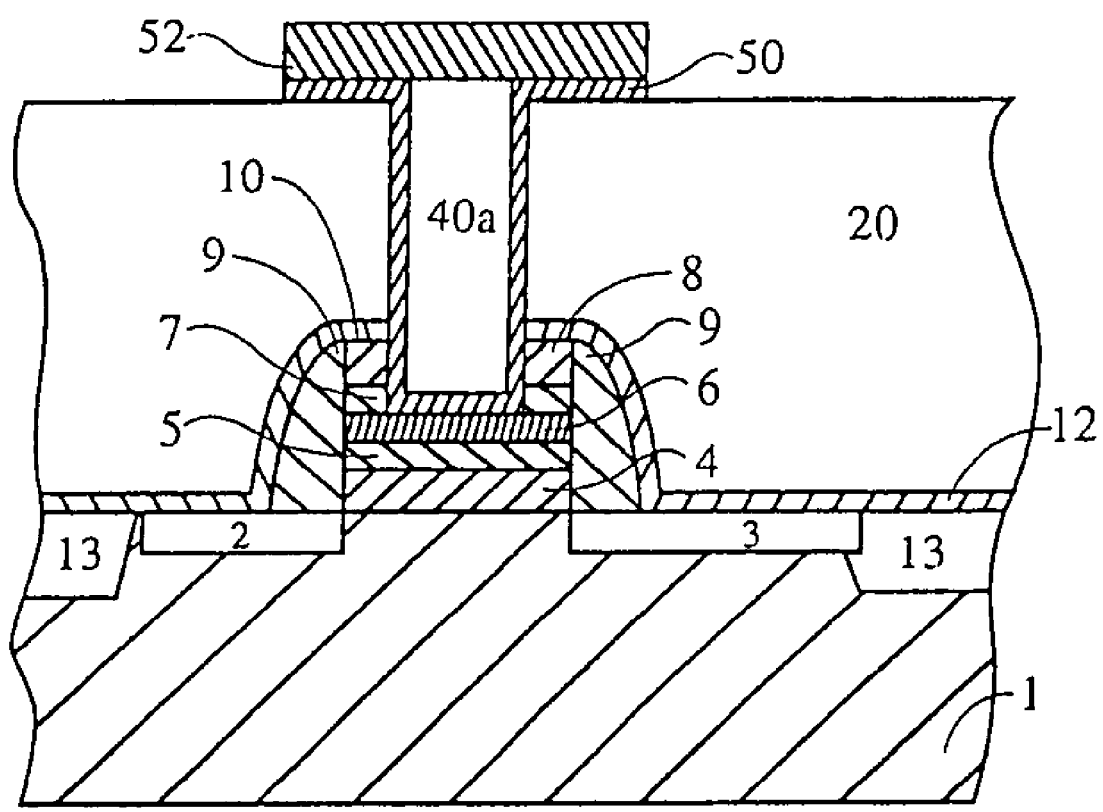
FIG. 12 is a side cross-sectional view of the structure of FIG. 11 after the titanium oxynitride film and the metal layer have been patterned so as to form a titanium oxynitride structure and an interconnect structure in accordance with one embodiment of the present invention.

In the embodiment illustrated in FIG. 12, step 110 is performed by depositing (coating), exposing, and developing a layer of photoresist material to form a masking structure. That portion of titanium oxynitride film 30a and metal layer 42 that are not covered by the overlying masking structure are then etched, simultaneously forming titanium oxynitride structure 50 and forming metal interconnect structure 52. Interconnect structure 52 is electrically coupled to titanium oxynitride structure 50 and electrically couples titanium oxynitride structure 50 to other circuitry on semiconductor substrate 1.

In an alternate embodiment the titanium oxynitride film and the metal layer are separately patterned. In this embodiment the titanium oxynitride film is patterned by performing mask and etch steps to complete the titanium oxynitride structure prior to depositing the metal layer (step 109) that is to be used as an interconnect. The metal layer is then patterned, forming an interconnect structure that at least partially overlies the titanium oxynitride structure. Though this embodiment adds additional process steps, an interconnect can be obtained that has a shape that is different from the shape of the resistor structure.

In one embodiment, a thin film resistor formed in accordance with method 100 of FIG. 1 is used to form mixed-mode integrated circuit devices such as analog devices. However, the methods and apparatus of the present invention not limited to these types of integrated circuit devices.

Though FIGS. 1–12 illustrate an embodiment in which the resistor couples to a gate, alternatively the resistor could couple to other structures. In one alternate embodiment the resistor couples to an underlying metal interconnect. In another embodiment the resistor couples to a source region or to a drain region. Alternatively, multiple resistors can be used that couple to each of a gate, a source, and a drain.

The thin film resistor of the present invention has good resistance stability. It has been found the resistance of the thin film resistor of the present invention does not significantly change after being stored in a fabrication environment for five days. This is a significant improvement as compared to a titanium nitride film (deposited using a chemical vapor deposition process) that has not been annealed using the rapid thermal anneal process of step 106 (which will have a resistance that will continue to increase steadily over time).

Figure 13:
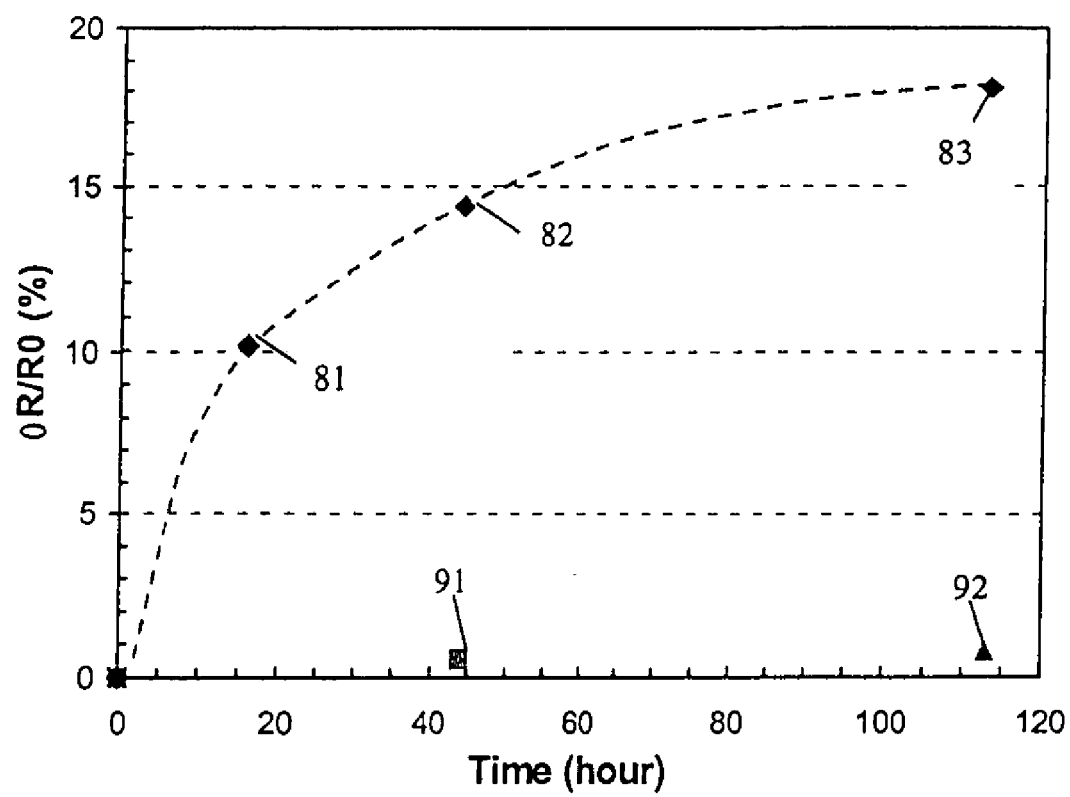
FIG. 13 is a graph that illustrates changes in resistance over time for an as-deposited titanium nitride film, for a titanium nitride film that has been annealed using a rapid thermal anneal process in an oxygen ambient at 425 degrees centigrade and for a titanium nitride film that has been annealed using a rapid thermal anneal process in an oxygen ambient at 450 degrees centigrade in accordance with one embodiment of the present invention.

FIG. 13 shows points 81–83 which represent the change of resistance over time for an as-deposited titanium nitride film. It can be seen that the resistance significantly increases over time. In contrast, the resistance of a CVD titanium nitride film that has been annealed using a rapid thermal anneal process in an oxygen ambient at 425 degrees centigrade, illustrated by point 91, does not significantly increase over time. Similarly, the resistance of a CVD titanium nitride film that has been annealed using a rapid thermal anneal process in an oxygen ambient at 450 degrees centigrade, illustrated by point 92, does not significantly increase over time.

The resistivity of titanium oxynitride structure 50 can be varied within a wide range of resistivity to meet the needs of a particular application. More particularly, a titanium oxynitride structure 50 can be formed having a resistance of from approximately 100 to $10^6$ Ohms/square with a thickness of approximately 100 Angstrom and square pattern (length equals to width). This is a significantly wider range than can be obtained from other metallic thin film resistors such as Chromium-based films (which have a range of from $10^3$ to $10^4$ ohms/square).

Moreover, in applications where a high resistivity is needed, the methods of the present invention allow for forming a thin film resistor having a desired high resistance with excellent stability. Also the methods and structure of the present invention provide a resistor structure that takes up less real estate on the semiconductor wafer, allowing the design to meet the requirement of the scaling technology.

Also, because titanium nitride is commonly used in standard VLSI semiconductor fabrication processes, the methods of the present invention are easily integrated into current fabrication processes. Also, the thin film resistor of the present invention has good resistance stability irrespective of the subsequent process flow (i.e., thermal cycles, ambient, etc.).

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming a thin film resistor on a semiconductor substrate having a gate structure disposed thereover, said method comprising:
    forming a first layer of dielectric material that overlies said gate structure;
    forming an opening in said first layer of dielectric material, said opening extending through said first layer of dielectric material so as to expose a portion of said gate structure;
    depositing a layer of titanium nitride using a chemical vapor deposition process portions of said layer of titanium nitride extending within said opening so as to partially fill said opening;
    performing a rapid thermal anneal in an oxygen environment so as to form a titanium oxynitride film; and
    patterning said titanium oxynitride film so as to form a titanium oxynitride structure over said semiconductor substrate.

2. A method as recited in claim 1 wherein said titanium oxynitride structure has a first portion that overlies said exposed portion of said gate structure and has a second portion that overlies a top surface of said first layer of dielectric material, said titanium oxynitride structure including a third portion that extends vertically between said first portion and said second portion.

3. A method as recited in claim 2 wherein said opening in said first layer of dielectric material is rounded and wherein said third portion is cylindrical.

4. A method as recited in claim 1 further comprising depositing a layer of silicon nitride over said gate structure, said layer of silicon nitride disposed between said gate structure and said first layer of dielectric material.

5. A method as recited in claim 4 wherein said gate structure includes a conductive layer, said opening extending through said layer of silicon nitride so as to expose said conductive layer, said first portion of said titanium oxynitride structure directly overlying said conductive layer and electrically coupled to said conductive layer.

6. A method as recited in claim 1 wherein said step of performing a rapid thermal anneal further comprises flowing oxygen gas and nitrogen gas into a rapid thermal anneal chamber while said substrate is heated to a temperature of from 400 to 500 degrees centigrade for a time of from ten to sixty seconds.

7. A method as recited in claim 1 wherein said first portion and said second portion of said titanium oxynitride structure partially fill said opening in said dielectric layer, said method further comprising depositing and etching a second layer of dielectric material so as to form a dielectric plug that fills a remaining portion of said opening in said first layer of dielectric material.

8. A method as recited in claim 7 wherein said patterning said titanium oxynitride film further comprises:
    depositing a metal layer over said titanium oxynitride film;
    forming a photoresist masking structure over said metal layer, said photoresist masking structure exposing portions of said metal layer; and
    performing an etch process to simultaneously pattern said metal layer and said titanium oxynitride film.

9. A method for forming a thin film resistor on a semiconductor substrate having a gate structure disposed thereover, said method comprising:
    forming a first layer of dielectric material that overlies said gate structure;
    forming an opening in said first layer of dielectric material, said opening extending through said first layer of dielectric material so as to expose a portion of a conductive layer of said gate structure;
    depositing a layer of titanium nitride using a chemical vapor deposition process, portions of said layer of titanium nitride extending within said opening so as to partially fill said opening;
    performing a rapid thermal anneal in an oxygen environment so as to form a titanium oxynitride film;
    depositing a second layer of dielectric material, said second layer of dielectric material overlying said titanium oxynitride film and filling a remaining portion of said opening;
    etching a portion of said second layer of dielectric material so as to form a dielectric plug that fills said remaining portion of said opening; and
    etching portions of said titanium oxynitride film so as to form a titanium oxynitride structure having a first portion that overlies said exposed portion of said conductive layer and having a second portion that overlies a top surface of said first layer of dielectric material and having a third portion that extends vertically between said first portion and said second portion.

10. A method as recited in claim 9 wherein said etching portions of said titanium oxynitride film further comprises:
    depositing a metal layer over said titanium oxynitride film;
    forming a photoresist masking structure over said metal layer, said photoresist masking structure exposing portions of said metal layer; and
    performing an etch process to simultaneously pattern said metal layer and said titanium oxynitride film.

* * * * *

UNITED STATES PATENT AND TRADEMARK OFFICE
CERTIFICATE OF CORRECTION

PATENT NO. : 7,078,306 B1 Page 1 of 1
APPLICATION NO. : 10/805718
DATED : July 18, 2006
INVENTOR(S) : Jin et al.

It is certified that error appears in the above-identified patent and that said Letters Patent is hereby corrected as shown below:

Column 9, line 25, after the word "process" insert --,--.

Signed and Sealed this

Twenty-seventh Day of March, 2007

JON W. DUDAS
*Director of the United States Patent and Trademark Office*